United States Patent [19]

Machida et al.

[11] Patent Number: 5,714,267

[45] Date of Patent: Feb. 3, 1998

[54] SEED CRYSTAL OF SILICON SINGLE CRYSTAL

[75] Inventors: Norihisa Machida, Saitama-ken; Hisashi Furuya, Tokyo, both of Japan

[73] Assignees: Mistsubishi Material Corporation; Mitsubishi Materials Silicon Corporation, both of Tokyo, Japan

[21] Appl. No.: 626,280

[22] Filed: Apr. 4, 1996

[30] Foreign Application Priority Data

Apr. 20, 1995 [JP] Japan .................... 7-095138

[51] Int. Cl.$^6$ ............................ B32B 9/04
[52] U.S. Cl. .................. 428/446; 428/167; 428/212; 428/409
[58] Field of Search ............... 428/167, 446, 428/212, 409, 375; 422/249, 245; 156/645.1; 117/72, 943; 423/324, 328

[56] References Cited

U.S. PATENT DOCUMENTS

| | | | |
|---|---|---|---|
| 4,515,755 | 5/1985 | Matsuo et al. | 422/246 |
| 5,264,189 | 11/1993 | Yamashita et al. | 422/249 |
| 5,290,395 | 3/1994 | Matsumoto et al. | 422/132 |
| 5,306,474 | 4/1994 | Kida et al. | 422/249 |

*Primary Examiner*—Donald Loney
*Attorney, Agent, or Firm*—McAulay Fisher Nissen Goldberg & Kiel, LLP

[57] ABSTRACT

Thermal stress at a point portion of a seed crystal generated when the seed crystal is brought into contact with molten silicon liquid is relieved, thereby to prevent generation of dislocation, to curtail the time of a seed contraction process and to surely support a heavy weight single crystal. A seed crystal of a silicon single crystal used when the single crystal is grown from molten silicon liquid by a Czochralski method is formed to show the heat emissivity of 0.5 or higher and lower than 1.0 at the point portion of the seed crystal. The point portion of the seed crystal is either a part or the whole of the portion that makes contact with the molten silicon liquid or a portion that makes contact with the molten silicon liquid and a portion that makes no contact with the molten silicon liquid in the vicinity of that portion. It is desirable to form at least 16 lines per 1 cm$^2$ of fine grooves each having a width of 0.3 to 1.0 mm on the surface of the point portion of the seed crystal, to form microscopic irregularity on the surface of the point portion by sandblasting the surface of the point portion of the seed crystal, or to form a SiO$_2$ film on the surface of the point portion by applying oxidizing treatment to the surface of the point portion of the seed crystal.

25 Claims, 5 Drawing Sheets

41

SEED CRYSTAL OF SILICON SINGLE CRYSTAL

BACKGROUND OF THE INVENTION

1. Field of the Invention

The present invention relates to a seed crystal of a silicon single crystal used when a single crystal is grown from molten silicon liquid by a Czochralski method (a CZ method), and more particularly to a surface of a point portion of a seed crystal that makes contact with molten silicon liquid.

2. Description of the Related Art

A Czochralski method (hereinafter mentioned as a CZ method) in which a silicon single crystal of high impurity for a semiconductor is grown from molten silicon liquid in a crucible has been heretofore known as a method of growing a silicon single crystal. According to this method, it is possible to obtain a dislocation-free single crystal bar having required orientation by having a mirror-etched seed crystal make contact with the molten silicon liquid, drawing up the seed crystal so as to produce a seed contraction portion from the molten silicon liquid and growing a crystal thereafter by fattening it gradually to obtain a diameter of an objective silicon bar. Since slip dislocation is introduced into a seed crystal due to thermal stress generated when a seed crystal makes contact with the molten silicon liquid in obtaining this single crystal, which makes it difficult to obtain a dislocation-free single crystal, a Dash method is widely utilized in general (W. C. Dash. J. Appl. Phys. 29 736-737 (1958)).

According to this Dash method, the dislocation propagated from slip dislocation introduced into the seed crystal is extinguished by forming a seed contraction portion while making a seed crystal diameter smaller once to approximately 3 mm after the seed crystal is brought into contact with the molten silicon liquid, thus obtaining a dislocation-free single crystal. Namely, in the Dash method, a seed contraction portion having a small diameter becomes necessary for a single crystal portion that is made to grow continuously from the seed crystal.

However, the single crystal has also become heavy in weight as the diameter of the single crystal has become larger in recent years and the strength is insufficient to support a single crystal that has become heavier at a conventional seed contraction portion having a very small diameter, thus causing a fear that such a serious accident that the single crystal bar drops because of the damage of the seed contraction portion. Further, in the Dash method, a comparatively long period of time is required to perform seed contraction, and it is required to perform seed contraction over again once the seed contraction is unsuccessful, thus causing such a nonconformity as lowering efficiency in a growth process.

In order to solve such a problem, a method of using a crystal holding mechanism (Unexamined Published Japanese Patent Application No. 63-25299) and a method of heating a seed crystal with a heater (Unexamined Published Japanese Patent Application No. 4-104988) have been proposed. In the latter method in particular, it is possible to aim at shortening of time by relieving the thermal stress generated when the seed crystal is brought into contact with the molten silicon liquid by heating the seed crystal with a heater in advance.

In the former method, however, it is required to form the crystal configuration into a specific configuration at time of growing the crystal, and further to newly install a complicated mechanism for holding the crystal. Further, in the latter method, heating equipment becomes necessary, and such a problem required to be solved that the mechanism of the heater becomes complicated since the heater is provided on a holder that holds the seed crystal and moves it in particular has been still in existence.

SUMMARY OF THE INVENTION

It is an object of the present invention to provide a seed crystal of a silicon single crystal capable of relieving thermal stress generated at a point portion of a seed crystal when the seed crystal is brought into contact with molten silicon liquid, preventing generation of dislocation and shortening the period of the seed contraction process.

It is another object of the present invention to provide a seed crystal of a silicon single crystal capable of preventing generation of dislocation and surely supporting a heavy weight crystal by making the diameter of the seed contraction portion larger.

The present invention relates to improvement of seed crystals 31, 41 and 61 of silicon single crystals used when the single crystals are grown from molten silicon liquid by the Czochralski method as shown in FIG. 1 to FIG. 6.

The featured structure thereof exists in that the heat emissivity at the point portion of the seed crystal is 0.5 or higher and lower than 1.0.

The point portion of the seed crystal is a part or the whole of a portion that makes contact with the molten silicon liquid or the portion that makes contact with the molten silicon liquid and the portion that makes no contact with the molten silicon liquid in the vicinity of that portion. By increasing the emissivity at the point portion of the seed crystal, the seed crystal itself shows a higher temperature by the radiation heat with infrared rays or the like. In particular, it is possible to further increase the calorific power by infrared rays or the like of the seed crystal itself by increasing the emissivity including the portion that makes no contact with the molten silicon liquid. The thermal stress at the point portion when the seed crystal comes into contact with the molten silicon liquid is relieved due to the fact that the seed crystal itself shows a higher temperature. When the emissivity is lower than 0.5, the emissivity is about the same as that a conventional seed crystal, and the thermal stress at the point portion of the seed crystal when the seed crystal is brought into contact with the molten silicon liquid cannot be relieved.

As shown in FIG. 1 and FIG. 2, it is desirable that at least 16 lines per 1 $cm^2$ of fine grooves 0.3 to 1.0 mm in width, respectively, are formed on the surface of the point portion of the seed crystal 31. Further, as shown in FIG. 3 and FIG. 4, microscopic irregularity may also be formed on the surface of the point portion by applying sandblasting treatment to the surface of the point portion of the seed crystal 41. This sandblasting treatment for forming the microscopic irregularity is one of surface treatment methods and includes a dry sandblasting method in which variety types of pulverulent bodies such as alumina, silicon carbide, glass powder and walnut shells are mixed into a compressed gaseous body such as air and nitrogen and blasted at a high pressure, a wet sandblasting method in which these pulverulent bodies are dispersed in a liquid such as water and blasted at a high pressure, or a liquid honing method.

Furthermore, as shown in FIG. 6 and FIG. 8, it is also possible to apply oxidizing treatment to the surface of the point portion of the seed crystal 61 thereby to Torma $SiO_2$ film 61a on the surface of the point portion thereof. Since the surface of the silicon single crystal has high affinity to oxygen, an oxide film is formed on the surface of the silicon single crystal immediately upon exposure to an oxidizing ambient atmosphere. The thermal oxidation of a silicon single crystal is performed generally in an ambient atmosphere such as $O_2$, $O_2$—$H_2O$, $H_2O$ and $H_2O$—$O_2$ combustion. Further, oxidizing treatment in an ambient atmosphere added with a halogen such as HCl or $Cl_2$ may also be adopted. The $SiO_2$ film 61a formed with the silicon single crystal is diffused, and a new reaction is generated on the interface thereof and oxidation proceeds. In other words, the interface proceeds successively into the silicon single crystal in the course of oxidation. The volume of the $SiO_2$ film 61a is expanded approximately twice as large due to the difference in molecular weight and density between the silicon single crystal and the $SiO_2$ film 61a, and the surface of the oxide film is different from the surface of the seed crystal before oxidation. Hence, it is possible to increase the emissivity.

Besides, the above-mentioned formation of fine grooves, sandblasting treatment and formation of the $SiO_2$ film may be independently adopted, respectively, or may be used in combination. It is possible to further improve the emissivity by combined use, and to further increase the calorific power of the seed crystal itself with infrared rays or the like.

In general, the emissivity means a ratio of radiation from a certain surface to radiation from a blackbody Planckian radiator at the same temperature as that of the surface, and radiation means energy propagated through a medium such as air. The emissivity changes depending on chemical composition of the surface of a substance, the thickness of the substance, the geometrical configuration of the surface, the surface roughness and so on. On the other hand, there is such relationship that the emissivity is normally equal to the absorptance of the substance (Kirchhoff's law). Namely, it may be said that maximum emission and absorption are made in a substance having high emissivity. Here, the absorptance shows a rate that infrared rays or the like are absorbed in a substance, and has such relationship that the total of the transmittance that shows a rate that infrared rays or the like transmit and the reflectivity that shows a rate of reflection is 1. It is shown that the calorific energy by infrared rays or the like is larger as the absorptance gets higher since, when infrared rays or the like are absorbed in a substance, the infrared rays or the like are converted into energy.

DESCRIPTION OF THE PREFERRED EMBODIMENTS

Next, embodiments of the present invention will be described in detail with reference to the drawings.

EMBODIMENT 1

Figure 7:
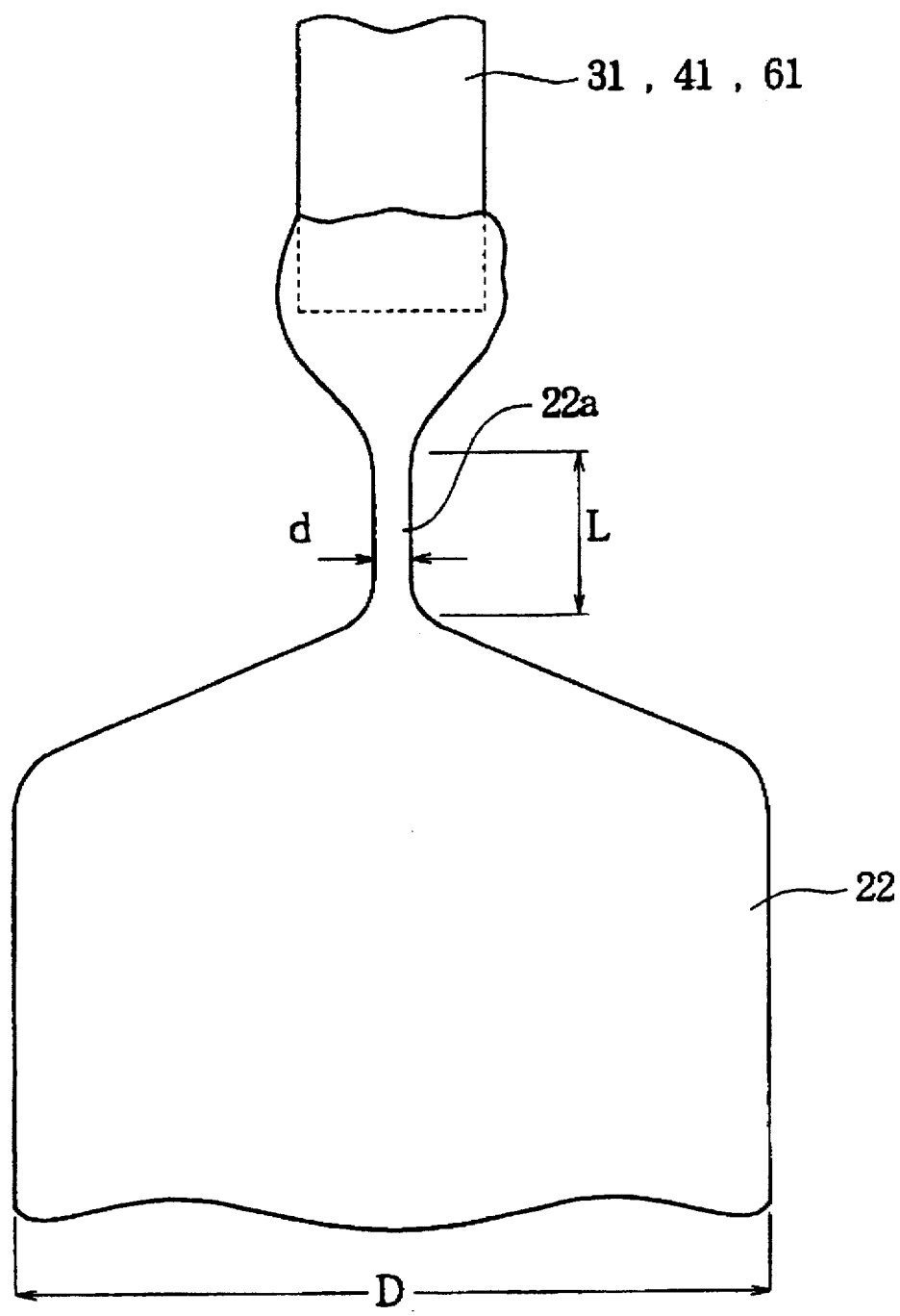
FIG. 7 is a diagram showing the growth of a single crystal using a seed crystal of the present invention.
Figure 8:
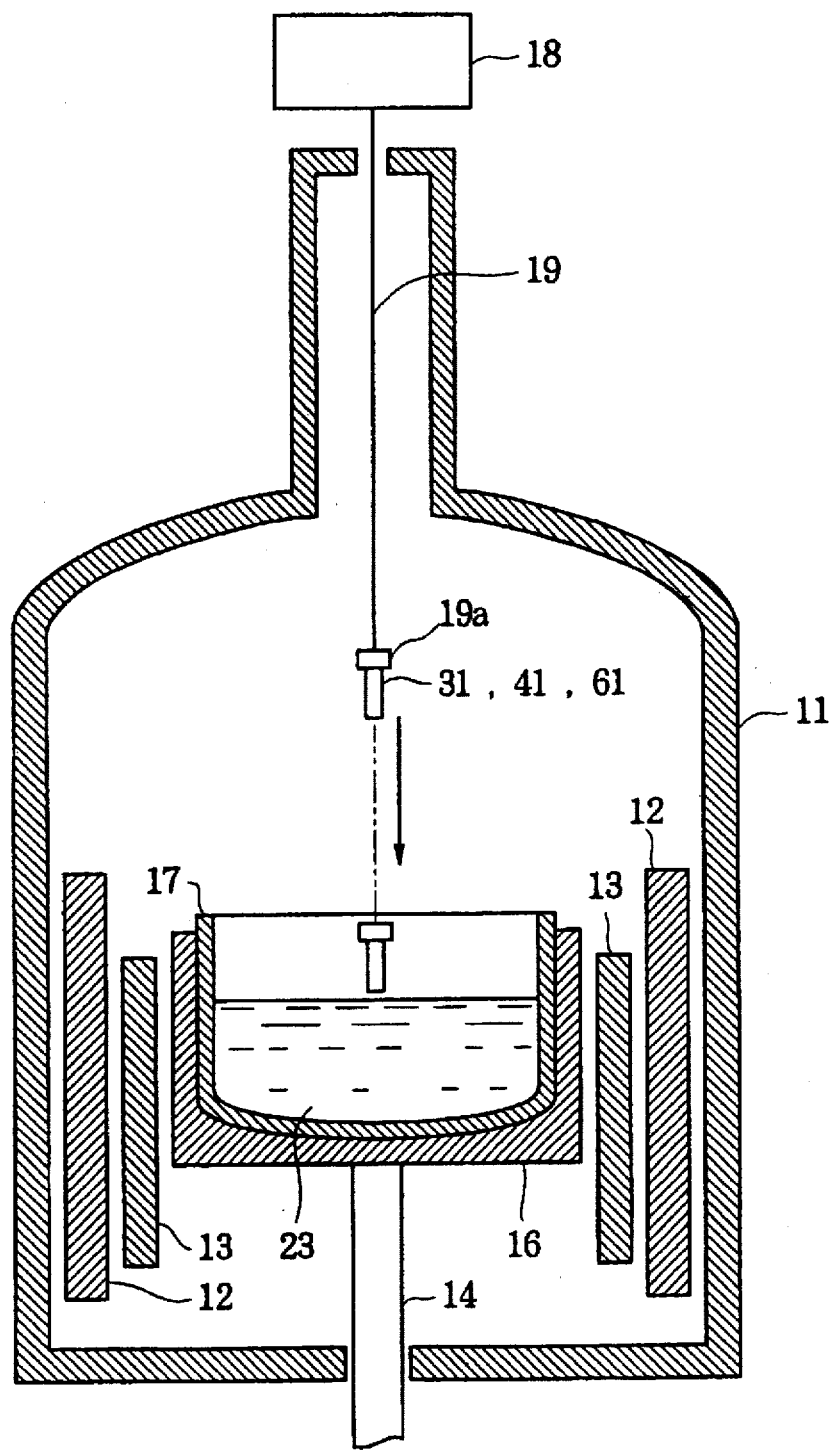
FIG. 8 is a schematic sectional view of a single crystal growing apparatus according to a CZ method.

As shown in FIG. 8, in a growth apparatus used when a single crystal is grown from molten silicon liquid by a CZ method, a heat insulator 12 and a heater 13 are disposed concentrically with a furnace body 11 inside the furnace body and a bottomed cylindrical quartz crucible 17 is fitted to a graphite susceptor 16 fixed at a top end of a rotary shaft 14 located at the center of the furnace body 11. A rotating and pulling-up mechanism 18 is provided above the furnace body 11, and a seed crystal 31 is disposed on a holder 19a suspended from the rotating and pulling-up mechanism 18 through a wire above the crucible 17. The rotating and pulling-up mechanism is arranged, as shown in FIG. 7, so that a silicon single crystal bar 22 of high purity grown from a seed crystal 31 is pulled up while rotating it thereby to grow the high purity silicon single crystal bar 22 at the lower end of the seed crystal 31.

Figure 1:
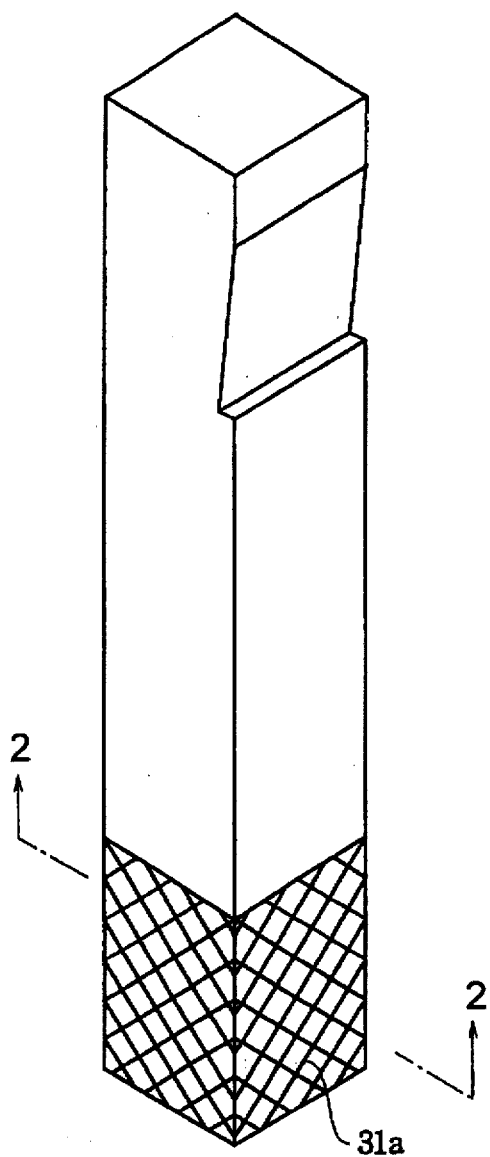
FIG. 1 is a perspective view showing a seed crystal according to a first embodiment of the present invention.
Figure 2:
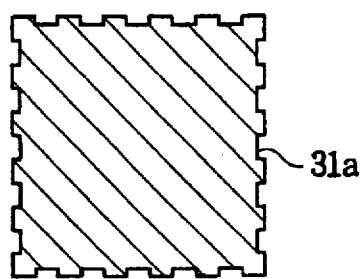
FIG. 2 is a sectional view of the seed crystal taken along a line A—A.

As shown in FIG. 1 and FIG. 2, fine grooves 31a are formed on the surface at the point portion of the seed crystal 31 of the silicon single crystal in this embodiment. The seed crystal 31 has a square pillar shape 10 mm square having a length of 50 mm. At least 16(4×4) lines per 1 $cm^2$ of fine grooves 31a 0.3 to 1.0 mm in width are formed on the surface at the point portion thereof. The fine grooves 31a are formed by machining using a diamond blade, end the formed length is approximately 50 mm from the point and the depth of the fine groove is approximately 0.3 to 1 mm.

EMBODIMENT 2

Figure 3:
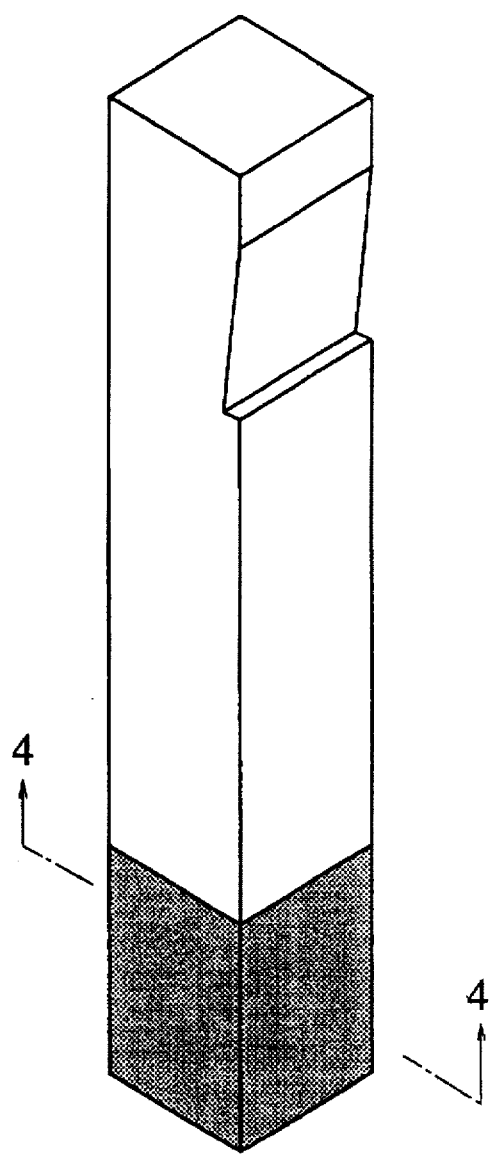
FIG. 3 is a perspective view showing a seed crystal according to a second embodiment of the present invention.
Figure 4:
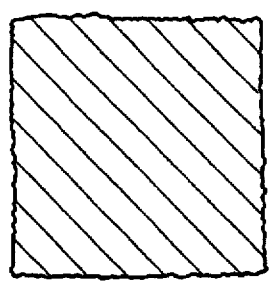
FIG. 4 is a sectional view of the seed crystal taken along a line B—B.

As shown in FIG. 3 and FIG. 4, the surface of the point portion of a seed crystal 41 of a silicon single crystal is applied with sandblasting and microscopic irregularity is formed on the surface of the point portion in this embodiment. This seed crystal 41 has the same shape and size as the seed crystal 31 in the embodiment 1, end sandblasting treatment is made by the dry sandblasting method in which silicon carbide is blasted, and the length where microscopic irregularity is formed is approximately 50 mm from the point.

EMBODIMENT 3

Figure 5:
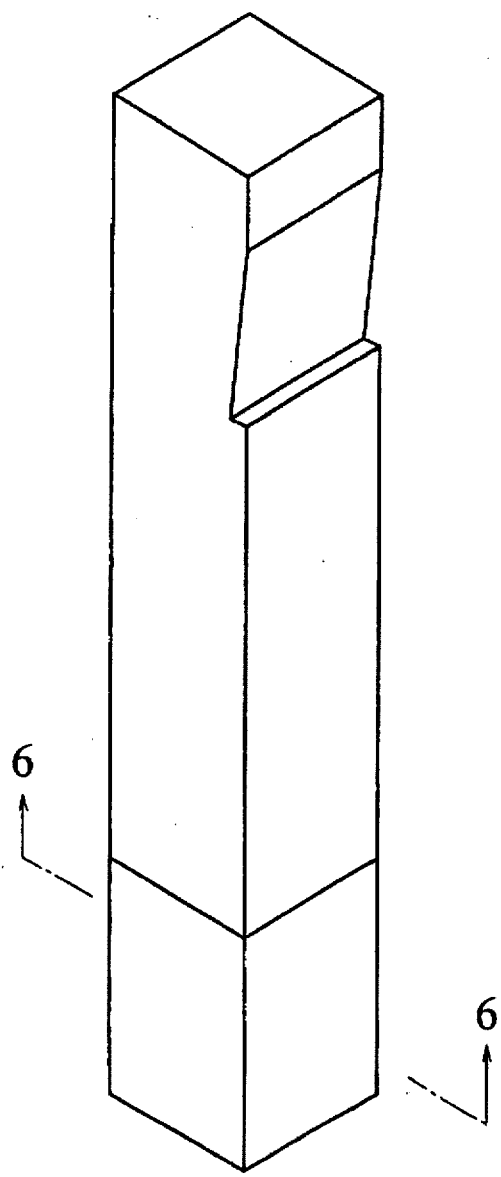
FIG. 5 is a perspective view showing a seed crystal according to a third embodiment of the present invention.
Figure 6:
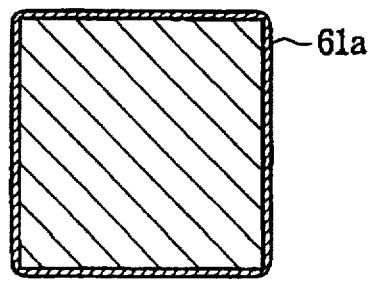
FIG. 6 is a sectional view of the seed crystal taken along a line C—C.

As shown in FIG. 5 and FIG. 6, the surface of the point portion of a seed crystal 61 of the silicon single crystal is applied with oxidation processing, and a $SiO_2$ film 61a is formed on the surface of the point portion. This seed crystal 61 has the same shape and size as those of the seed crystal 31 of the embodiment 1, and oxidation processing is performed with $O_2$—$H_2O$, and the length where the $SiO_2$ film 61a is formed is approximately 50 mm from the point.

EMBODIMENT 4

Although it is not illustrated, as in the case of the embodiment 1, at least 16(4×4) lines per 1 $cm^2$ of fine grooves 31a each having a width of approximately 0.3 to 1.0 mm and a depth of approximately 0.3 to 1.0 mm are formed on the surface of the point portion in the length of approximately 50 mm from the point, and thereafter, the surface applied with oxidizing treatment similarly to the embodiment 3, and a $SiO_2$ film is formed on the surface thereof in this embodiment. This seed crystal has the same shape and size as those of the seed crystal 31 of the embodiment 1, and the length where the SiO₂ film is formed is approximately 50 mm from the point.

COMPARISON EXAMPLE

A seed crystal (not shown) of a silicon single crystal with the point portion as it is mirror-etched without being applied with surface treatment having the same shape and size as those of the seed crystal 31 of the embodiment 1 was prepared.

In the growth of a single crystal from molten silicon liquid 23 by a CZ method using seed crystals 31, silicon single crystals of such embodiments 1 to 4, the temperature rises as compared with the seed crystal not shown in the comparison example 1, in which the surfaces of the seed crystals 31, 41 and 61 of the silicon single crystals are mirror-etched, by infrared rays or the like from the heater 13 when the seed crystals 31, 41 and 61 are brought into contact with the molten silicon liquid 23, and it is possible to relieve thermal stress at the point portion of the seed crystal when the seed crystals 31, 41 and 61 are brought into contact with the molten silicon liquid 23 by stretching the wire 19 by means of the rotating and pulling-up mechanism 18 as shown with an arrow mark in a solid line in FIG. 8.

After the whole point portions of the seed crystals 31, 41 and 61 are brought into contact with the molten silicon liquid 23, seed contraction to a specific diameter is performed and a seed contraction portion 22a is pulled up as shown in FIG. 7, the single crystal of the seed contraction portion 22a is made dislocation-free, which is what is called a Dash method, and the crystal is grown by fattening it gradually up to the diameter of the objective silicon single crystal bar 22 thereafter, thereby to obtain a dislocation-free single crystal bar 22 having required plane orientation. Here, the whole point portion means all the portions where the fine grooves 31a are formed in the seed crystal 31, all the portions applied with sandblasting treatment in the seed crystal 41, and all the portions where the SiO₂ film 61a is formed in the seed crystal and the seed crystal not shown in the embodiment 4.

Comparison test

First, the emissivity has been measured with an infrared radiometer with respect to seed crystals of silicon single crystals in the embodiments 1 to 4 and the comparison example 1. The results are shown in Table 1. Then, these data were incorporated into the single crystal growth apparatus shown in FIG. 8, respectively, and silicon single crystals having a total length of 500 mm were grown under the following same conditions.

Diameter (D) of silicon single crystal bar: 160 mm

Molten silicon liquid quantity in the crucible body: 32 kg

Crystal growth rate: 1.0 mm/min.

The dislocation state of the silicon single crystal bar of high purity that has been pulled up as described above was investigated, and the preheating hour until the seed crystal comes into contact with the molten silicon liquid, the seed contraction diameter d and the seed contraction length L were also measured. The results of measurement are shown in Table 1.

TABLE 1

| Seed type | Emissivity | Preheating hour | Seed contraction diameter | Seed contraction length | Crystal |
| --- | --- | --- | --- | --- | --- |
| Embodiment 1 | 0.8 | 30 min. | 5 mm | 120 mm | Dislocation-free |
| Embodiment 2 | 0.9 | 30 min. | 6 mm | 150 mm | Dislocation-free |
| Embodiment 3 | 0.7 | 30 min. | 4 mm | 100 mm | Dislocation-free |
| Embodiment 4 | 0.9 | 30 min. | 5.5 mm | 130 mm | Dislocation-free |
| Comparison example 1 | 0.2 | 30 min. | 3 mm | 200 mm | Dislocation-free |

As it is apparent from Table 1, the emissivities of the seed crystals in the embodiments 1 to 4 were three times or higher of the emissivity of the seed crystal of the comparison example 1. In particular, the embodiment 2 in which sandblasting treatment was performed and the embodiment 4 in which a SiO₂ seed crystals in the embodiments 1 to 4 were three times or higher of the emissivity of the seed crystal of the comparison example 1. In particular, the embodiment 2 in which sandblasting treatment was performed and the embodiment 4 in which a SiO₂ film was formed after fine grooves were formed showed values close to a blackbody Planckian radiator. Further, no dislocation was noticed at all in the silicon single crystal bar produced by using the seed crystal in the comparison example and the silicon single crystal bars produced by using the seed crystals in the embodiments 1 to 4. In the silicon single crystal bars produced by using the seed crystals in the embodiments 1 to 4, however, it was possible to make the seed contraction diameter d larger as compared with the comparison example 1, and furthermore, to shorten the seed contraction length L. This is considered to be due to lowering of the thermal stress originated in the fact that the seed crystals are warmed before making contact with molten silicon liquid.

As described above, according to the present invention, is possible to relieve the thermal stress at the point portion of the seed crystal when it makes contact with the molten silicon liquid by increasing the heat emissivity of the point portion of the seed crystal so that the point portion of the seed crystal absorbs radiant heat by infrared rays or the like better so as to generate heat. With this, it is possible to shorten the length of the seed contraction portion of the seed crystal according to the present invention. Thus, it is possible to prevent generation of dislocation and also to curtail the period of the seed contraction process. Further, as a result that the seed contraction diameter can be made larger, it is possible to surely support a heavy weight crystal by using the seed crystal of the silicon single crystal according to the present invention.

What is claimed is:

1. A seed crystal for use in growing a silicon single crystal by contacting a first portion of the seed crystal with molten liquid silicon then pulling the seed crystal from the molten silicon liquid, the seed crystal having a heat emissivity of about 0.5 to about 1.0 at a second portion of the seed crystal, wherein the second portion of the seed crystal comprises at least a part of the first portion.

2. A seed crystal according to claim 1, wherein the second portion of the seed crystal further comprises at least a part of the seed crystal not in the first portion.

3. A seed crystal according to claim 2, wherein at least 16 lines per cm² of fine grooves each having a width of 0.3 to 1.0 mm are formed on a surface of the second portion.

4. A seed crystal according to claim 3, wherein a surface of the second portion is applied with sandblasting treatment thereby to form microscopic irregularity on the surface of second portion.

5. A seed crystal according to claim 2, wherein a surface of the second portion is applied with sandblasting treatment thereby to form microscopic irregularity on the surface of the second portion.

6. A seed crystal according to claim 5, wherein a surface of the second portion is applied with oxidizing treatment and a $SiO_2$ film is formed on the surface of second portion.

7. A seed crystal according to claim 5, wherein a surface of the second portion is applied with oxidizing treatment and a $SiO_2$ film is formed on the surface of second portion.

8. A seed crystal according to claim 2, wherein a surface of the second portion is applied with oxidizing treatment and a $SiO_2$ film is formed on the surface of second portion.

9. A seed crystal according to claim 1, wherein at least 16 lines per 1 $cm^2$ of fine grooves each having a width of 0.3 to 1.0 mm are formed on a surface of the second portion.

10. A seed crystal according to claim 9, wherein a surface of the second portion is applied with sandblasting treatment thereby to form microscopic irregularity on the surface of the second portion.

11. A seed crystal according to claim 10, wherein a surface of the second portion is applied with oxidizing treatment and a $SiO_2$ film is formed on the surface of second portion.

12. A seed crystal according to claim 9, wherein a surface of the second portion is applied with oxidizing treatment and a $SiO_2$ film is formed on the surface of second portion.

13. A seed crystal according to claim 1, wherein a surface of the second portion is applied with sandblasting treatment thereby to form microscopic irregularity on the surface of the second portion.

14. A seed crystal according to claim 13, wherein a surface of the second portion is applied with oxidizing, treatment and a $SiO_2$ film is formed on the surface of second portion.

15. A seed crystal according to claim 1, wherein a surface of the second portion is applied with oxidizing treatment and a $SiO_2$ film is formed on the surface of the second portion.

16. A seed crystal for use in growing a silicon single crystal by contacting a first portion of the seed crystal with molten liquid silicon then pulling the seed crystal from the molten silicon liquid, the seed crystal having a heat emissivity of about 0.5 to about 1.0 at a second portion of the seed crystal, wherein the second portion of the seed crystal further comprises at least a part of the seed crystal not in the first portion.

17. A seed crystal according to claim 16, wherein at least 16 lines per $cm^2$ of fine grooves each having a width of 0.3 to 1 mm are formed on a surface of the second portion.

18. A seed crystal according to claim 17, wherein a surface of the second portion is applied with sandblasting treatment thereby to form microscopic irregularity on the surface of the second portion.

19. A seed crystal according to claim 18, wherein a surface of the second portion is applied with oxidizing treatment and a $SiO_2$ film is formed on the surface of second portion.

20. A seed crystal according to claim 16, wherein a surface of the second portion is applied with sandblasting treatment thereby to form microscopic irregularity on the surface of the second portion.

21. A seed crystal according to claim 20, wherein a surface of the second portion is applied with oxidizing treatment and a $SiO_2$ film is formed on the surface of second portion.

22. A seed crystal according to claim 16, wherein a surface of the second portion is applied with oxidizing treatment and a $SiO_2$ film is formed on the surface of second portion.

23. A seed crystal for use in growing a silicon single crystal by contacting a first portion of the seed crystal with molten liquid silicon then pulling the seed crystal from the molten silicon liquid, the seed crystal having a heat emissivity of about 0.5 to about 1.0 at a second portion of the seed crystal, wherein at least 16 lines per 1 $cm^2$ of fine grooves each having a width of 0.3 to 1.0 mm are formed on a surface of the second portion.

24. A seed crystal according to claim 23, wherein a surface of the second portion is applied with sandblasting treatment thereby to form microscopic irregularity on the surface of the second portion.

25. A seed crystal according to claim 23, wherein a surface of the second portion is applied with oxidizing treatment and a $SiO_2$ film is formed on the surface of second portion.

* * * * *